US006229715B1

(12) United States Patent
Hwang

(10) Patent No.: US 6,229,715 B1
(45) Date of Patent: May 8, 2001

(54) CIRCUIT CARD GUIDE ASSEMBLY

(75) Inventor: Liang Hwang, Old Bridge, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/440,507

(22) Filed: Nov. 15, 1999

(51) Int. Cl.[7] ................................................. H05R 9/00
(52) U.S. Cl. .......................... 361/818; 361/816; 361/800; 174/35 R; 174/358 MS
(58) Field of Search .................................... 361/818, 800, 361/796, 797, 816, 825, 752, 753, 799, 726, 727, 731, 732, 736, 740, 801, 802; 174/35 R, 35 GC, 35 MS; 439/607–610

(56) References Cited

U.S. PATENT DOCUMENTS

| | | | | |
|---|---|---|---|---|
| 4,857,668 | * | 8/1989 | Buonanno | 174/35 GC |
| 5,233,507 | * | 8/1993 | Gunther et al. | 361/818 |
| 6,038,138 | * | 3/2000 | Dayton et al. | 361/769 |
| 6,043,991 | * | 3/2000 | Sorrentino | 361/816 |
| 6,058,025 | * | 5/2000 | Ecker et al. | 361/816 |

* cited by examiner

Primary Examiner—Leo P. Picard
Assistant Examiner—Hung Van Duong
(74) Attorney, Agent, or Firm—David L. Davis

(57) ABSTRACT

An electronic system having circuit cards insertable into a shelf unit, with shielding between adjacent circuit cards, is provided with a guide fin assembly having protruding guide fins between adjacent circuit card faceplates to limit cumulative tolerance build up between inserted circuit cards.

7 Claims, 4 Drawing Sheets

CIRCUIT CARD GUIDE ASSEMBLY

BACKGROUND OF THE INVENTION

This invention relates to the provision of electromagnetic interference and electrostatic discharge shielding of an electronic system and, more particularly, to a guide assembly for circuit cards which are part of such an electronic system.

Modern electronic systems equipment, such as for telecommunications purposes, is often constructed as modular circuit cards inserted into guide slots of mechanical card cages, or shelf units, for engagement with a backplane mounted to the shelf unit at the inward ends of the guide slots. The outward edge of each circuit card is fastened to a faceplate assembly which holds a latch for releasably retaining the circuit card in the shelf unit. Although the circuit cards are relatively closely packed, there are still gaps between adjacent faceplate assemblies. There are also gaps in the faceplate assemblies to allow portions of the latches to pass therethrough. All of these gaps allow electromagnetic interference radiation to leak therethrough. In addition, the gaps allow electrostatic discharge to pass therethrough, possibly causing damage to circuit components mounted on the circuit cards. A need therefore exists to provide shielding against electromagnetic interference and electrostatic discharge for such electronic systems equipment.

It is known to provide such shielding by encasing the electronic components within a conductive housing. While this"closed door" approach is satisfactory, there exists a need to provide such shielding under"open door" conditions, for example where a door to the enclosure is open to allow access to the equipment for maintenance purposes.

These needs have been addressed, for example, by a shielding assembly disclosed in co-pending U.S. patent application Ser. No. 09/309,930, filed May 11, 1999, and assigned to the assignee of this invention. As disclosed in the referenced application, each faceplate assembly secured to a circuit card includes an elongated conductive U-shape bracket member extending at least the length of the circuit card edge with the base wall of the U-shape being orthogonal to the circuit card. Secured to one side wall of each of the bracket members is a respective resilient compressible conductive gasket which extends the length of its respective bracket member. Each bracket member has its respective gasket secured to the same corresponding side wall as all the other bracket members so that between each adjacent pair of bracket members there is a single respective gasket. This seals all the gaps between adjacent faceplate assemblies.

While the aforedescribed assembly is effective, it has been found that the circuit card faceplate width can have dimensional variation that is considered acceptable in the manufacture process. However, this accumulation of variation (tolerance build-up) along with the springiness of the gaskets between adjacent faceplates can decrease the available opening for a circuit card to plug in between previously inserted cards. The tolerance build up is such that the first few circuit cards can be plugged in, but as there are more circuit cards in an adjacent group, the faceplates and gaskets start flaring out like an"accordion". The build up can be such that the last few circuit cards are difficult or impossible to install. Accordingly, a need exists to overcome this problem without at the same time diminishing the shielding effect of the aforedescribed assembly.

SUMMARY OF THE INVENTION

According to the present invention, a plurality of guide fins are mount ed to the front of the shelf unit. Each of the guide fins is parallel to the guide slots and the guide fins are located and spaced so that each guide fin is between a respective pair of adjacent faceplate assembly bracket member side walls.

In accordance with an aspect of this invention, an elongated bracket is secured to the front of the shelf unit and extends across the plurality of guide slots. The plurality of guide fins are formed unitarily with the bracket.

In accordance with another aspect of this invention, an elongated angle bracket is secured to the front of the shelf unit and extends across a plurality of guide slots. The angle bracket has first and second orthogonally related sides and a plurality of aligned pairs of openings. One of the openings in each pair is in the bracket first side and the other opening in each pair is in the bracket second side. Each fin includes a pair of tabs each adapted for insertion in a respective opening of a respective pair of openings.

In accordance with a further aspect of this invention, each fin includes a third tab bent orthogonally to the fin and adapted to be spot welded to one of the angle bracket sides.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
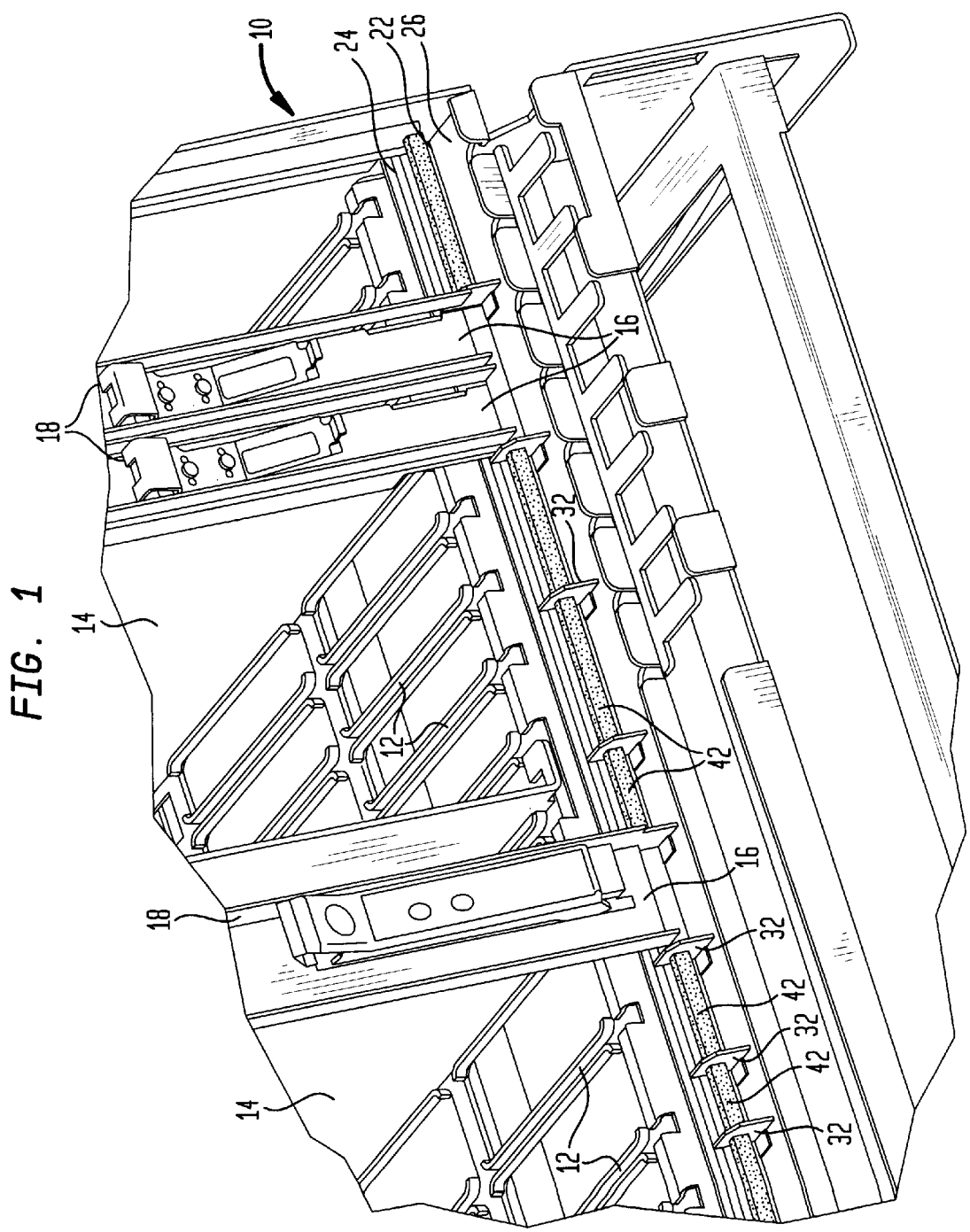
FIG. 1 is a perspective view showing a first embodiment of the present invention.

FIG. 1 shows a shelf unit 10 for an electronic system. The shelf unit 10 has a plurality of parallel spaced guide slots 12 for holding a plurality of circuit cards 14 in a parallel spaced array. Secured to an edge of each of the circuit cards is a faceplate assembly 16. Each of the faceplate assemblies 16 is accessible from outside the shelf unit 10 so that the respective circuit card 14 can be selectively installed and removed from the shelf unit 10. Illustratively, each faceplate assembly 16 includes an elongated conductive U-shaped bracket member 18 extending at least the length of the circuit card 14 edge. The base wall of the bracket member 18 is orthogonal to the circuit card 14 and the two side walls of the bracket member 18 extend parallel to and away from the circuit card 14.

Figure 5:
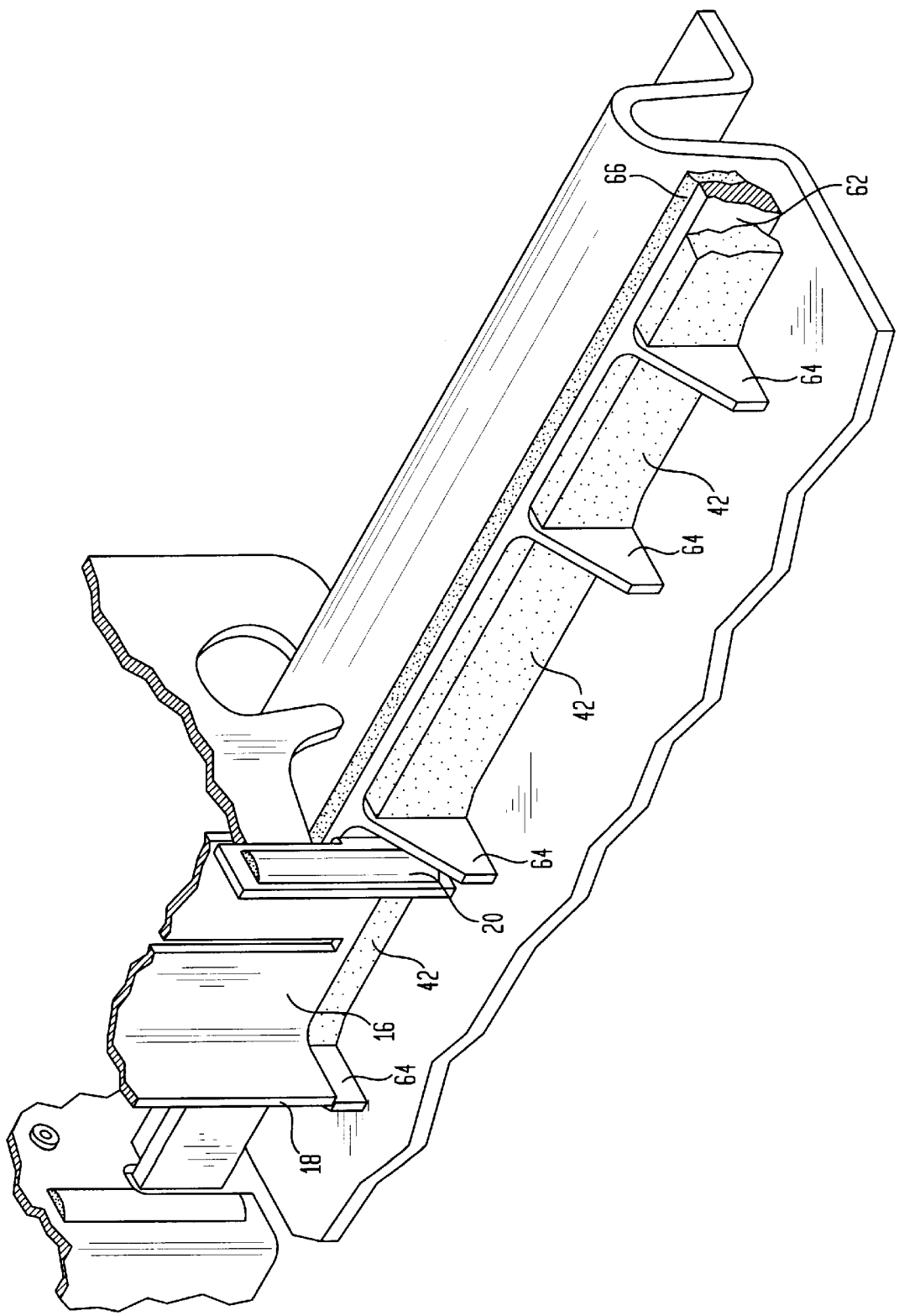
FIG. 5 is a perspective view showing a third embodiment of the present invention.

Secured to the same corresponding side wall of each of the bracket members 18 is a respective resilient compressible conductive gasket 20 (FIG. 5). The gasket 20 extends substantially the entire length of its respective bracket member 18 and in its uncompressed state extends away from its respective bracket member 18 in a direction orthogonal to the respective circuit card 14 by a distance greater than the spacing between facing bracket member side walls of adjacent circuit card faceplate assemblies. The foregoing is fully disclosed in the afore referenced co-pending U.S. patent application.

It is the build up caused by the accumulation of the gaskets 20 which causes the circuit cards 14 to flex forwardly of the guide slots 12 so as to decrease the space between faceplate assemblies 16. Briefly, according to the present invention, the faceplate assemblies 16 are maintained in position by providing a plurality of guide fins mounted to the front of the shelf unit 10. Each of the guide fins is parallel to the guide slots 12 and the guide fins are located and spaced so that each guide fin is between a respective pair of adjacent faceplate assembly bracket member side walls.

Figure 2:
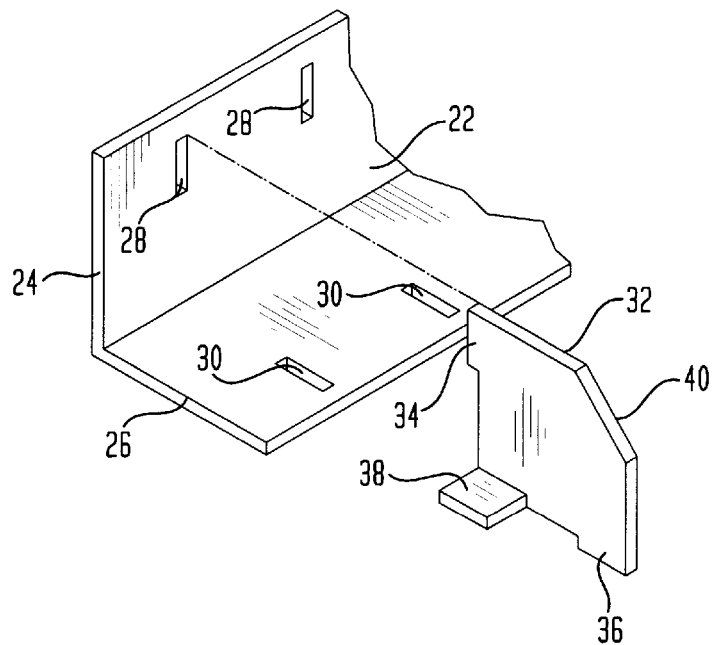
FIG. 2 is an enlarged and exploded perspective view of a portion of the embodiment shown in FIG. 1.

Thus, according to a first embodiment of this invention, as shown in FIGS. 1 and 2, an elongated angle bracket 22 is secured to the front of the shelf unit 10, as by adhesive, welding, or any other suitable means, and extends across a plurality of the guide slots 12. As best seen in FIG. 2, the angle bracket 22 has first and second orthogonally related sides 24, 26. Aligned pairs of openings 28, 30 are provided each in a respective one of the sides 24, 26. As shown, the openings 28, 30 are elongated and rectangular in shape. Each guide fin 32 is formed of sheet material so that it is generally planar with a pair of tabs 34, 36. The tabs 34, 36 are adapted each for insertion in a respective opening 28, 30. In addition, each guide fin 32 is formed with a third tab 38 which is bent orthogonally to the major plane of the guide fin 32 and is adapted to be spot welded to the side 26 of the angle bracket 22 after the tabs 34, 36 are inserted in the openings 28, 30. The guide fin 32 is preferably chamfered at its leading edge 40 and the gasket 20 (FIG. 5) is similarly chamfered at its end. This chamfering of the guide fin 32 eases the insertion of the faceplate assembly 16 between adjacent guide fins 32 and the removal of gasket material insures that the faceplate assembly bracket member 18 will fit between adjacent guide fins 32. To maintain the shielding effect, gaskets 42 may be secured to the side 24 of the angle bracket 22 between adjacent guide fins 32, as shown in FIG. 1. While the guide fin structure has been shown only along a lower edge of the shelf unit 10, it is understood that a similar, but inverted, guide fin structure is provided along an upper edge of the shelf unit 10 as well.

Figure 4:
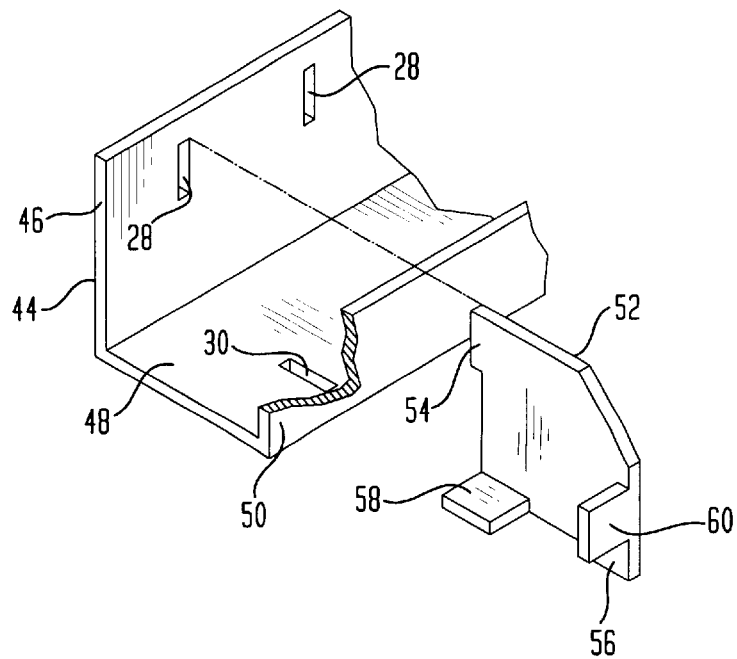
FIG. 4 is an enlarged and exploded perspective view of a portion of the embodiment shown in FIG. 3.
Figure 3:
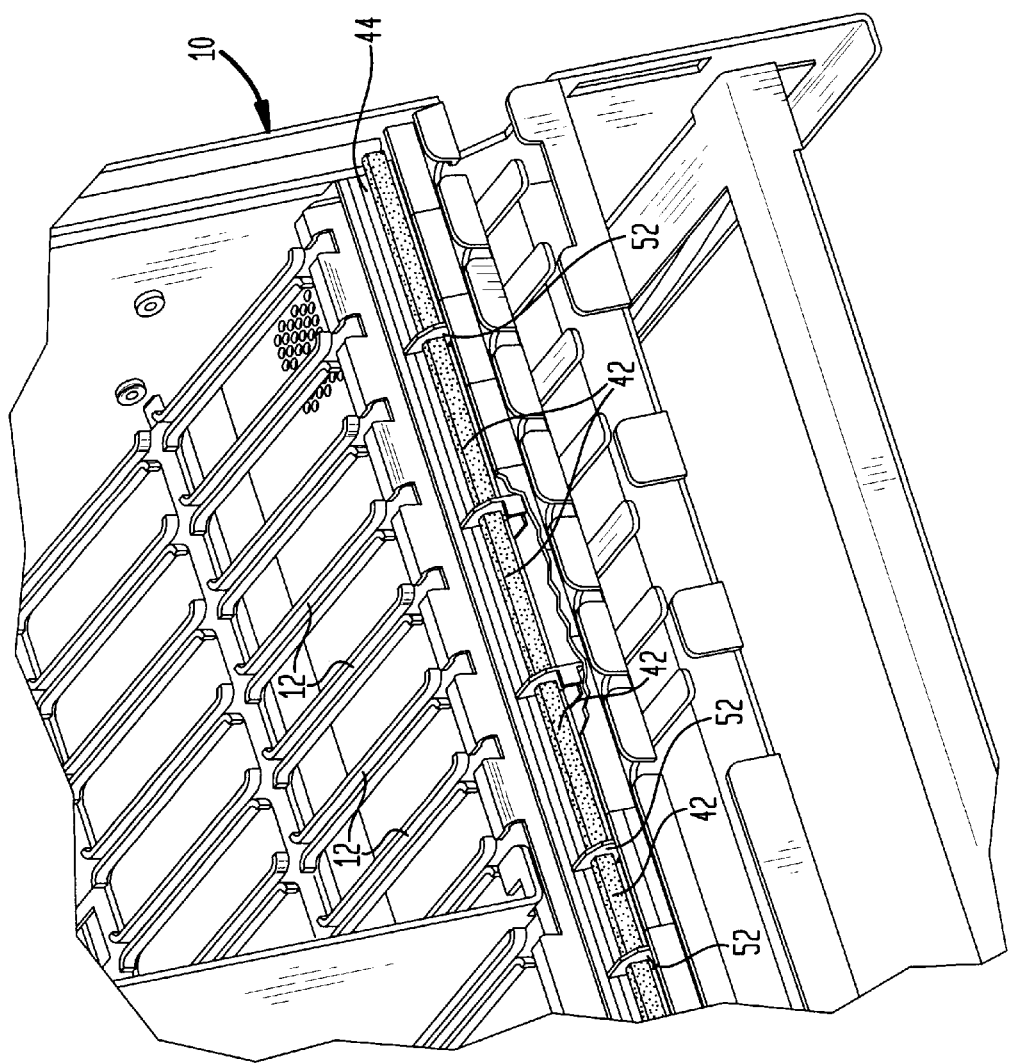
FIG. 3 is a perspective view, partially broken away, showing a second embodiment of the present invention.

FIGS. 3 and 4 disclose a second embodiment according to the present invention wherein the angle bracket 44 has three orthogonally related sides 46, 48, 50 to form a channel for holding the guide fins. The sides 46, 48 have the aligned pairs of openings 28, 30. The guide fin 52 is formed the same as the guide fin 34 with the tabs 54, 56, 58 as before and with an additional tab 60 which is adapted to be spot welded to the side 50 of the angle bracket 44.

FIG. 5 shows a third embodiment of this invention wherein the bracket 62 and the plurality of guide fins 64 are formed unitarily as a single cast piece. As shown, the bracket 62 is secured to the front of the shelf unit 10 by double faced adhesive tape 66.

Accordingly, there has been disclosed an improved guide assembly for circuit cards which are part of an electronic system which is shielded from electromagnetic interference and electrostatic discharge. While several embodiments of the present invention have been disclosed herein, it is understood that various adaptations and modifications to the disclosed embodiments are possible and it is intended that this invention be limited only by the scope of the appended claims. Thus, while the faceplate assembly has been shown as having a U-shaped bracket, the present invention can be utilized with other types of faceplate assemblies, such as those having solid blocks or box-like brackets, for example.

What is claimed is:

1. In an assembly for shielding an electronic system from electromagnetic interference and electrostatic discharge, the electronic system having a shelf unit with parallel spaced guide slots for holding a plurality of circuit cards side by side in a parallel array, the assembly comprising:

a plurality of faceplate assemblies each secured to an edge of a respective one of said plurality of circuit cards, wherein each of said faceplate assemblies is accessible from outside said shelf unit for installing and removing the respective circuit card from the shelf unit, and wherein each of said faceplate assemblies includes an elongated conductive bracket member extending at least the length of the circuit card edge with two side walls of the bracket member extending parallel to the respective circuit card; and a plurality of resilient compressible conductive gaskets each secured to one side wall of a respective bracket member, each gasket extending the length of its respective bracket member, wherein each gasket in its uncompressed state extends away from its respective bracket member in a direction orthogonal to the respective circuit card by a distance greater than the spacing between facing bracket member side walls of adjacent circuit card faceplate assemblies;

wherein each bracket member has its respective gasket secured to the same corresponding side wall as all the other bracket members so that between each adjacent pair of bracket members there is a single respective gasket filling the gap between facing bracket member side walls;

THE IMPROVEMENT COMPRISING:

a plurality of guide fins mounted to the front of the shelf unit, each of the guide fins being parallel to the guide slots, the guide fins being located and spaced so that each guide fin is between a respective pair of adjacent faceplate assembly bracket member side walls.

2. The improvement according to claim 1 further including an elongated bracket secured to the front of the shelf unit and extending across a plurality of guide slots, and wherein the plurality of guide fins are formed unitarily with the bracket.

3. The improvement according to claim 1 further including an elongated angle bracket secured to the front of the shelf unit and extending across a plurality of guide slots, the angle bracket having first and second orthogonally related sides and a plurality of aligned pairs of openings, wherein one of the openings in each pair is in said angle bracket first side and the other opening in each pair is in said angle bracket second side, and wherein each guide fin includes a pair of tabs each adapted for insertion in a respective opening of a respective pair of openings.

4. The improvement according to claim 2 further including a plurality of resilient compressible conductive gaskets secured to the elongated bracket each between a respective pair of guide fins.

5. The improvement according to claim 3 wherein each guide fin includes a third tab bent orthogonally to the guide fin and adapted to be spot welded to one of the angle bracket sides.

6. The improvement according to claim 4 wherein:

the angle bracket includes a third side spaced from and parallel to the angle bracket first side to form a channel holding the plurality of guide fins; and each guide fin includes a fourth tab bent orthogonally to said each guide fin and adapted to be spot welded to the angle bracket third side.

7. The improvement according to claim 4 further including a plurality of resilient compressible conductive gaskets secured to a side of the angle bracket each between a respective pair of guide fins.

* * * * *